United States Patent [19]

Munday et al.

[11] Patent Number: 5,631,843
[45] Date of Patent: May 20, 1997

[54] PROGRAMMABLE ELECTRICAL ENERGY METER AND METHODS THEREFOR

[75] Inventors: Mark L. Munday; Rodney C. Hemminger, both of Raleigh, N.C.

[73] Assignee: ABB Power T&D Company Inc., Raleigh, N.C.

[21] Appl. No.: 659,326

[22] Filed: Jun. 6, 1996

Related U.S. Application Data

[62] Division of Ser. No. 534,693, Sep. 27, 1995, Pat. No. 5,555,508, which is a continuation of Ser. No. 259,578, Jun. 14, 1994, abandoned, which is a continuation of Ser. No. 839,182, Feb. 21, 1992, abandoned.

[51] Int. Cl.⁶ .................................................. G06F 17/00
[52] U.S. Cl. .................................................. 364/492
[58] Field of Search .................................. 364/492, 483, 364/464.04, 487; 324/15, 110, 76.52; 340/635, 637, 870.02, 870.03, 660; 379/106

[56] References Cited

U.S. PATENT DOCUMENTS

| | | | |
|---|---|---|---|
| 4,509,128 | 4/1985 | Coppola et al. | 364/483 |
| 5,544,089 | 8/1996 | Hemminger et al. | 364/492 |
| 5,548,527 | 8/1996 | Hemminger et al. | 364/492 |
| 5,555,508 | 9/1996 | Munday et al. | 364/492 |

*Primary Examiner*—Ellis B. Ramirez
*Attorney, Agent, or Firm*—Woodcock Washburn Kurtz Mackiewicz & Norris

[57] ABSTRACT

Methods and apparatus for metering electrical energy are disclosed in an electronic meter. Such meter includes a first processor for determining electrical energy from voltage and current signals and for generating an energy signal representative of the electrical energy determination and a second processor for receiving the energy signal and for generating an indication signal representative of said energy signal. An option connector is connected to the first and second processors, whereby the energy signal is provided to the option connector and a communication connection is provided between the option connector and the second processor. It is preferred for the option connector to be provided power signals such used by the meter in order to power any electronic components which may be connected to the option connector. It is also preferred to provide the option connector with certain operation signals such as a power fail signal, a master reset signal, an end of demand signal, and a KYZ signal. It is still further preferred to provide the option connector with the potential to communicate with various components of the meter, such as serial data communication, communication signals transmitted and received through an optical port and display signals. It is also preferred for the first processor to include a comparator, connected to receive a precision voltage and a reference voltage, wherein a comparator signal is generated whenever the reference voltage exceeds the precision voltage.

20 Claims, 10 Drawing Sheets

PROGRAMMABLE ELECTRICAL ENERGY METER AND METHODS THEREFOR

This is a division, of application Ser. No. 08/534,693 (now U.S. Pat. No. 5,555,508) filed on Sep. 27, 1995, which is a continuation of Ser. No. 08/259,578 filed on Jun. 14, 1994 now abandoned, which is a continuation of 07/839,182 filed on Feb. 21, 1992 (now abandoned) the disclosure of which is herein incorporated by reference.

FIELD OF INVENTION

The present invention relates generally to the field of utility company meters for metering electrical energy. More particularly, the present invention relates to both electronic watthour meters and meters utilized to meter real and reactive energy in both the forward and reverse directions.

BACKGROUND OF THE INVENTION

Meters for metering the various forms of electrical energy are well known. Utility company meters can be of three general types, namely, electro-mechanical based meters (output generated by a rotating disk), purely electronic component based meters (output component generated without any rotating parts) and a hybrid mechanical/electronic meter. In the hybrid meter, a so-called electronic register is coupled, usually optically, to a rotating disk. Pulses generated by the rotating disk, for example by light reflected from a spot painted on the disk, are utilized to generate an electronic output signal.

It will be appreciated that the use of electronic components in electric energy meters has gained considerable acceptance due to their reliability and extended ambient temperature ranges of operation. Moreover, contemporary electronic signal processing devices, such as microprocessors, have a greater accuracy potential for calculating electrical energy use than prior mechanical devices. Consequently, various forms of electronic based meters have been proposed which are virtually free of any moving parts. Several meters have been proposed which include a microprocessor.

U.S. Pat. No. 4,298,839—Johnston, incorporated herein by reference, discloses a programmable alternating current electric energy meter having a radiation responsive external data interface. The meter is shown to include a metering sequence logic control circuit which in the preferred embodiment is stated to be formed by a single-chip microcomputer, type MK 3870 available from Mostek Corporation of Carrollton, Tex. The logic control circuit is said to be operative to calculate and accumulate different measured parameters of an electrical energy quantity. Current and voltage components are provided to the logic control circuit from a convertor which produces current and voltage pulses at a rate proportional to the rate of the particular electrical energy consumed. The converter incorporates a rotating disk.

U.S. Pat. No. 4,467,434—Hurley et al., discloses a solid-state watt-hour meter which includes a current sensing device and a voltage sensing device coupled to a Hall-effect sensing and multiplying device. The Hall-effect device is coupled to a microprocessor.

U.S. Pat. No. 4,692,874—Mihara, discloses an electronic watt-hour meter which includes a single microprocessor and a power measuring device. The power measuring device is described as including an electric power converting circuit and a frequency divider. The electric power converting circuit provides an output pulse, the frequency of which is divided by the frequency divider. The frequency divider, however, is dependent upon a frequency dividing, ratio setting signal generated by the microprocessor.

U.S. Pat. No. 4,542,469—Brandyberry et al., discloses a hybrid type meter having a programmable demand register with a two-way communication optical port. The demand register is said to include a central processing unit such as the NEC 7503 microcontroller. The microcontroller is utilized not only for controlling and monitoring the demand register, but also to perform power and energy calculations.

U.S. Pat. No. 4,884,021—Hammond et al. discloses a meter for metering polyphase power sources wherein cycles for each phase are sampled at each degree and converted to a binary representation of amplitude. Conversion is described as being carried out in two steps, the first being a range conversion where the sampled amplitude is evaluated with respect to eleven possible ranges of amplitude or scaling factors. That range data is then stored and the sample is amplified in accordance with the desired range code and submitted to an analogue to digital converter. A general purpose digital signal processor is said to be utilized for treating the parameters derived from each sample and to develop pulse outputs which can be further processed or displayed by devices of conventional use in the industry. An electronic register is provided which is said to be controlled by a conventional microprocessor. The implementation of Hammond's range conversion scheme results in the energy measurement components effectively being "hard coded" with the particular metering scheme, thereby significantly reducing the adaptability of the meter for various known applications. The use of such a meter in the various utility company applications requires either keeping several different meter types in inventory, i.e. one meter type for each type of application, or one meter into which all application forms have been incorporated. It will be appreciated that one meter into which all application forms have been incorporated would be exorbitantly expensive.

Meters, such as those described above, which incorporate registers, are generally programmable at two levels. At the first level, firmware can be masked into a register in a relatively short period of time. At the second level, so-called soft switches can be programmed into non-volatile memory, i.e., electrically erasable programmable read only memory, to tell the firmware which algorithms to perform. Such systems work well for presently provided base metering data. However, such systems cannot change basic meter functions nor are they adaptable to use with additional hardware. While adequate for present applications, such metering systems are significantly non-flexible in relation to future needs and/or developments in both hardware and programmability.

U.S. Pat. No. 4,077,061—Johnston et al. discloses a digital processing and calculating AC electric energy metering system. This system includes a single central processing unit for performing all energy determinations, system control and information display. Although this system does provide energy determination as output signals from the system, the system is not adaptable for modification of basic metering functions from external hardware or in relation to external communication signals.

Consequently, a need exits for an electronic meter which is designed to be programmable to the extent that basic metering functions can be changed relatively easily and which is economically adaptable for use with additional hardware. Such a meter would be capable of modification to handle various meter forms, to store calibration constants and to be capable of modification for future metering requirements. The present invention solves the aforementioned problems through the use of a distributed processing electronic meter incorporating a metering processor which is adaptable to multiple metering applications and which is utilized to perform all electrical energy determinations and a second processor which generates a display signal based on such electrical energy determinations, serves to control the overall operation of the meter and which provides access to processing, storage and display information for future hardware additions.

SUMMARY OF THE INVENTION

The above problems are overcome and the advantages of the invention are achieved in methods and apparatus for metering electrical energy in an electronic meter. Such meter includes a first processor for determining electrical energy from voltage and current signals and for generating an energy signal representative of the electrical energy determination and a second processor for receiving the energy signal and for generating an indication signal representative of said energy signal. An option connector is connected to the first and second processors, whereby the energy signal is provided to the option connector and a communication connection is provided between the option connector and the second processor. It is preferred for the option connector to be provided power signals such used by the meter in order to power any electronic components which may be connected to the option connector. It is also preferred to provide the option connector with certain operation signals such as a power fail signal, a master reset signal, an end of demand signal, and a KYZ signal. It is still further preferred to provide the option connector with the potential to communicate with various components of the meter, such as serial data communication, communication signals transmitted and received through an optical port and display signals. It is also preferred for the first processor to include a comparator, connected to receive a precision voltage and a reference voltage, wherein a comparator signal is generated whenever the reference voltage exceeds the precision voltage. It is also preferred for the meter to include a non-volatile memory such as an electrically erasable programmable read only memory connected to the first and second processors, for storing data used by the processors and for storing information generated by the processors.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DETAILED DESCRIPTION

Figure 1:
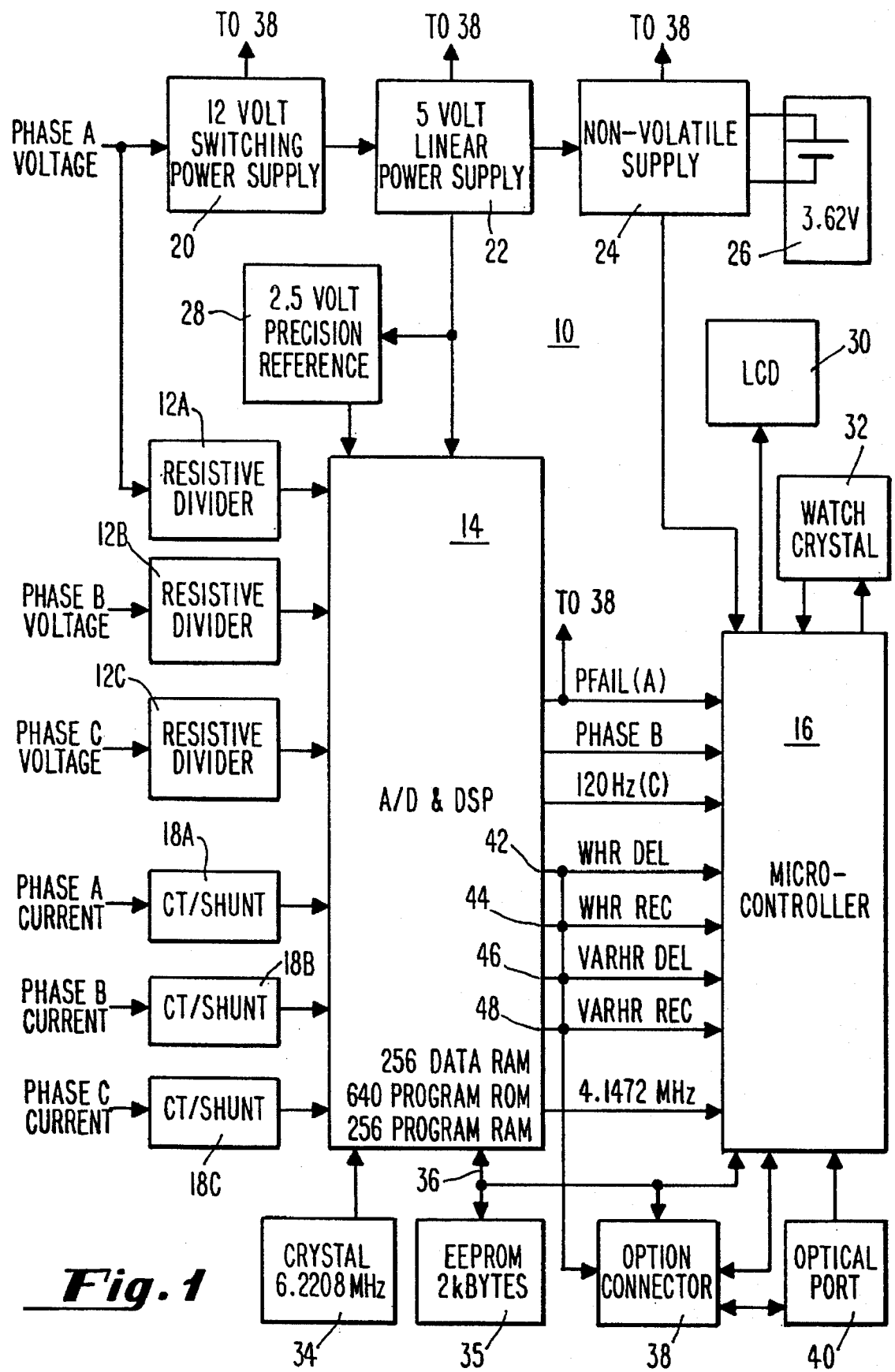
FIG. 1 is a block diagram of an electronic meter constructed in accordance with the present invention.

A new and novel meter for metering electrical energy is shown in FIG. 1 and generally designated 10. It is noted at the outset that this meter is constructed so that the future implementation of higher level metering functions can be supported. Such future implementation feature is described in greater detail herein.

Meter 10 is shown to include three resistive voltage divider networks 12A, 12B, 12C; a first processor—an ADC/DSP (analog-to-digital converter/digital signal processor) chip 14; a second processor—a microcontroller 16 which in the preferred embodiment is a Mitsubishi Model 50428 microcontroller; three current sensors 18A, 18B, 18C; a 12 V switching power supply 20 that is capable of receiving inputs in the range of 96–528V; a 5 V linear power supply 22; a non-volatile power supply 24 that switches to a battery 26 when 5 V supply 22 is inoperative; a 2.5 V precision voltage reference 28; a liquid crystal display (LCD) 30; a 32.768 kHz oscillator 32; a 6.2208 MHz oscillator 34 that provides timing signals to chip 14 and whose signal is divided by 1.5 to provide a 4.1472 MHz clock signal to microcontroller 16; a 2 kByte EEPROM 35; a serial communications line 36; an option connector 38; and an optical communications port 40 that may be used to read the meter. The inter-relationship and specific details of each of these components is set out more fully below.

It will be appreciated that electrical energy has both voltage and current characteristics. In relation to meter 10, voltage signals are provided to resistive dividers 12A–12C and current signals are induced in a current transformer (CT) and shunted. The output of CT/shunt combinations 18A–18C is used to determine electrical energy.

First processor 14 is connected to receive the voltage and current signals provided by dividers 12A–12C and shunts 18A–18C. As will be explained in greater detail below, processor 14 converts the voltage and current signals to voltage and current digital signals, determines electrical energy from the voltage and current digital signals and generates an energy signal representative of the electrical energy determination. Processor 14 will always generate watthour delivered (Whr Del) and watthour received (Whr Rec) signals, and depending on the type of energy being metered, will generate either volt amp reactive hour delivered (VARhr Del)/volt amp reactive hour received (VARhr Rec) signals or volt amp hour delivered (VAhr Del)/volt amp hour received (VAhr Rec) signals. In the preferred embodiment, each transition on conductors 42–48 (each transition from logic low to logic high or vice versa) is representative of the measurement of a unit of energy. Second processor 16 is connected to first processor 14. As will be explained in greater detail below, processor 16 receives the energy signal(s) and generates an indication signal representative of the energy signal.

In relation to the preferred embodiment of meter 10, currents and voltages are sensed using conventional current transformers (CT's) and resistive voltage dividers, respectively. The appropriate multiplication is accomplished in a new integrated circuit, i.e. processor 14. Although described in greater detail in relation to FIG. 2, processor 14 is essentially a programmable digital signal processor (DSP) with built in analog to digital (A/D) converters. The converters are capable of sampling three input channels simultaneously at 2400 Hz each with a resolution of 21 bits and then the integral DSP performs various calculations on the results.

Meter 10 can be operated as either a demand meter or as a so-called time of use (TOU) meter. It will be recognized that TOU meters are becoming increasingly popular due to the greater differentiation by which electrical energy is billed. For example, electrical energy metered during peak hours will be billed differently than electrical energy billed during non-peak hours. As will be explained in greater detail below, first processor 14 determines units of electrical energy while processor 16, in the TOU mode, qualifies such energy units in relation to the time such units were determined, i.e. the season as well as the time of day.

All indicators and test features are brought out through the face of meter 10, either on LCD 30 or through optical communications port 40. Power supply 20 for the electronics is a switching power supply feeding low voltage linear supply 22. Such an approach allows a wide operating voltage range for meter 10.

In the preferred embodiment of the present invention, the so-called standard meter components and register electronics are for the first time all located on a single printed circuit board (not shown) defined as an electronics assembly. This electronics assembly houses power supplies 20, 22, 24 and 28, resistive dividers 12A–12C for all three phases, the shunt resistor portion of 18A–18C, oscillator 34, processor 14, processor 16, reset circuitry (shown in FIG. 8), EEPROM 35, oscillator 32, optical port components 40, LCD 30, and an option board interface 38. When this assembly is used for demand metering, the billing data is stored in EEPROM 35. This same assembly is used for TOU metering applications by merely utilizing battery 26 and reprogramming the configuration data in EEPROM 35.

Consider now the various components of meter 10 in greater detail. Primary current being metered is sensed using conventional current transformers. It is preferred for the current transformer portion of devices 18A–18C have tight ratio error and phase shift specifications in order to limit the factors affecting the calibration of the meter to the electronics assembly itself. Such a limitation tends to enhance the ease with which meter 10 may be programmed. The shunt resistor portion of devices 18A–18C are located on the electronics assembly described above and are preferably metal film resistors with a maximum temperature coefficient of 20 ppm/° C.

The phase voltages are brought directly to the electronic assembly where resistive dividers 12A–12C scale these inputs to processor 14. In the preferred embodiment, the electronic components are referenced to the vector sum of each line voltage for three wire delta systems and to earth ground for all other services. Resistive division is used to divide the input voltage so that a very linear voltage with minimal phase shift over a wide dynamic range can be obtained. This in combination with a switching power supply allows the wide voltage operating range to be implemented.

Figure 6:
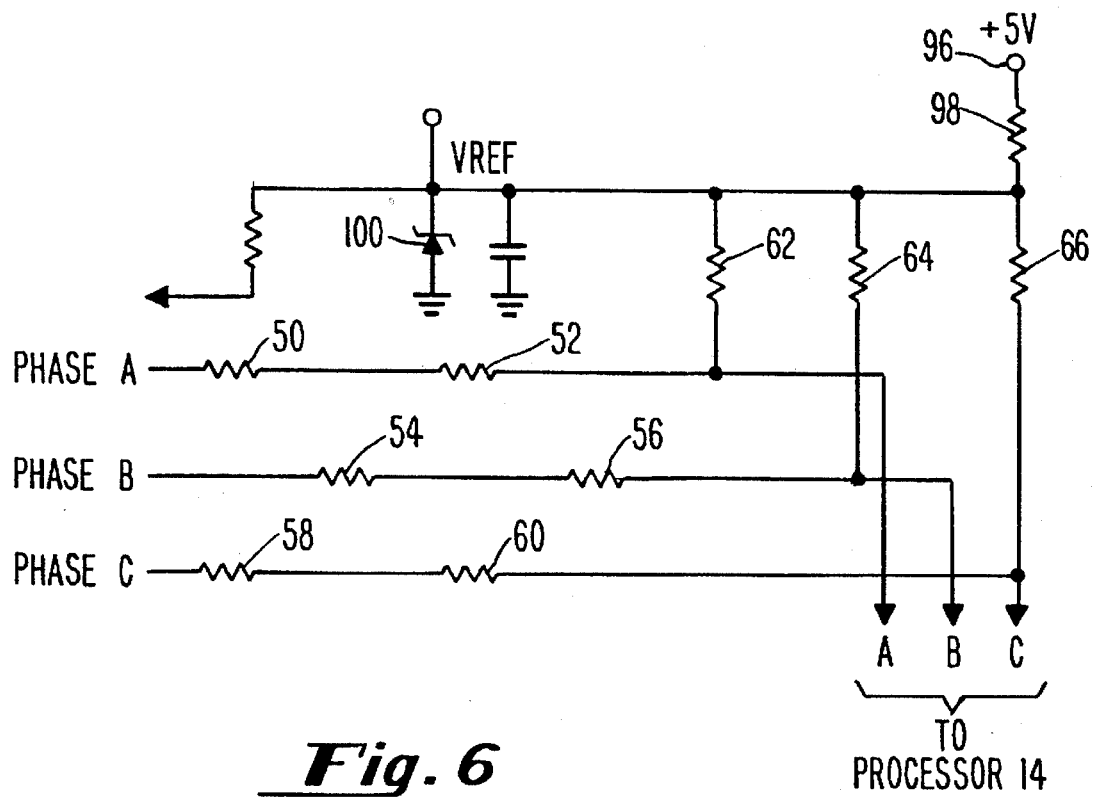
FIG. 6 is a schematic diagram of the resistive dividers and precision reference disclosed in FIG. 1.

Referring briefly to FIG. 6, each resistive divider consists of two 1 Meg, ½ watt resistors 50/52, 54/56 and 58/60, respectively. Resistors 50–60 are used to drop the line voltage at an acceptable watt loss. Each resistor pair feeds a third resistor 62, 64 and 66, respectively. Resistors 62–66 are metal film resistors having a maximum temperature coefficient of 25 ppm/° C. This combination is very inexpensive compared to other voltage sensing techniques. Resistors 50–60 have an operating voltage rating of 300 Vrms each. These resistors have been individually tested with the 6 kV IEEE 587 impulse waveforms to assure that the resistance is stable and that the devices are not destroyed. Resistors 62–66 scales the input voltage to be less than 1 Volt peak to peak to processor 14. It is noted that resistors 62–66 can be in a range from about 100 ohms to about 1 k ohms in order to assure this maximum peak to peak voltage and still maintain maximum signal.

On grounded, three wire delta systems, those components of the electronics assembly operating on logic voltage levels (including the battery connector) can be at an elevated voltage. In such situations, the two, 1 Meg resistor combinations (50/52, 54/56, 58/60) provide current limiting to the logic level electronics. The worse case current occurs during testing of a 480 V, 3 wire delta meter with single phase excitation.

It will be appreciated that energy units are calculated primarily from multiplication of voltage and current. The specific formulae utilized in the preferred embodiment, are listed in Table 1. It should be noted that the present embodiment provides a wide range of voltage operation as described in copending application, Attorneys Docket No. B900270/0010. This especially preferred embodiment allows four wire delta applications to be metered using a four wire wye meter executing the four wire wye equations in Table 1. However, for purposes of FIG. 2, such formulae are performed in processor 14. Processor 14 includes an analog converter 70 and a programmable DSP 72. Converter 70 includes, three three-channel, over-sampled, 2nd order, sigma-delta A/D converters, depicted as a 9 channel $\Sigma\Delta$ a analog-to-digital converter 74. The 6.2208 MHz clock signal is divided by 3 such that each A/D samples its input at 2.0736 MHz. Each A/D performs a 96:1 reduction or averaging for each input that results in an effective sample rate of 2.4 kHz on each of the three inputs per A/D. The resolution of these samples is equivalent to 21 bits, plus sign. It is noted that such a $\Sigma\Delta$ analog-to-digital conversion scheme results in a correct convergence by each A/D for each sample converted. It is recognized that the bandwidth for sash a conversion scheme is relatively small, however, the frequency of the voltage and current being converted is also relatively small.

In the preferred embodiment, the three voltage inputs, Va, Vb and Vc are sampled by one of the A/D's and the three current inputs Ia, Ib and Ic are sampled by a second A/D. The third A/D is used to sample either the voltage or current input of the B phase. Such sampling of the voltage or current input of the B phase is done because so-called 2 ½ element meters require the combination of the B phase current with one or both of the other phase currents. In addition, so-called two element meters require the B phase voltage to be combined with the other phase voltages to produce the line to line voltage. Having a third A/D enables these terms to be sampled simultaneously, thereby improving the measurement accuracy. This also improves the signal to noise ratio within processor 14.

DSP 72 is a reduced instruction set processor (RISC) which computes the desired energy quantities from the converted voltage and current samples. DSP 72 is shown to include a random access memory (RAM) memory 76 having a capacity of 256 bytes of data. Memory 76 is used to store computations and the subroutine stack. A read only memory (ROM) 78 is also shown and has a capacity of 640 bytes of data. Memory 78 is used to store those metering subroutines common to all energy calculation. Another RAM memory 80 is depicted and has a capacity of 256 bytes of data.

Memory 80 is used to store the main line program and specialized subroutines of DSP 72.

DSP 72 is also shown to include multiplier 82 and an accumulator 84 for processing the voltage and current digital signals thereby generating electrical energy information. There is also included arithmetic subtraction unit 86 interposed between multiplier 82 and accumulator 84.

From the foregoing, it should be appreciated that program ROM, i.e. memory 76 is defined at the oxide via level. As this defining step occurs relatively late in the manufacturing process for processor 14, changes can be made to such programming with minimal effort.

Calibration constants for each phase and certain potential linearization constants are stored in memory 80. Memories 76 and 80 are serially down-loaded from EEPROM 35 by microcontroller 16 on power-up of meter 10. Such an embodiment allows the benefit of being able to provide various meter forms economically, to calibrate without hardware modification, and permits the future addition of metering VAR or VA based on the per phase Vrms and Irms. The formulae for such operations are included in Table 1. Furthermore, the calculation of future, yet undefined, complex metering quantities could be obtained by merely reprogramming processor 14.

Processor 14 also contains a crystal oscillator (not shown), serial interface 88, power fail detect circuitry 90, and potential present outputs B and C. The crystal oscillator requires an external 6.2208 MHz crystal oscillator 34. Processor 14 uses this frequency directly for driving the DSP and indirectly for the A/D sampling. This frequency is also operated upon by clock generator 92 which serves to divide the output of oscillator 34 (input to processor 14 at XIN and XOUT) by 1.5, to buffer the divided clock signal and to output the divided clock signal at CK to processor 16 as its clock. This clock output is specified to work down to a supply voltage of 2.0 VDC.

Serial interface 88 is a derivation of the Signetics IIC bus. One serial address is assigned to processor 14. This address accesses one of the four DSP control registers. All information must pass through DSP data register 94 after writing the DSP address register. All memory, registers, and outputs of processor 14 can be read serially. A chip select line CS has been added to disable the communications buffer. The input CS is connected to and controlled by processor 16.

Power fail detection circuit 90 is a comparator which compares a divided representation of the supply voltage to a precision reference. The comparator's output at A concurrently provides a power fail signal and an indication of the presence of A phase voltage. Upon power fail, it is preferable to reset processor 14. In such a situation, the output pins Whr, Whd, etc. are forced to logic low voltage levels. Additionally, processor 14 goes into a lower power mode to reduce the current draw on power supply 20. In this lower power mode the comparator and oscillator operation are not affected, but DSP 72 ceases to operate.

The power failure voltage PF is generated by dividing the output of supply 22 to generate a voltage which is slightly greater than 2.5 V. In the preferred embodiment, a resistor voltage divider provides PF. Since PF is generated in relation to the Phase A voltage (FIG. 1), its presence is an indication that the Phase A voltage is also present.

Figure 7:
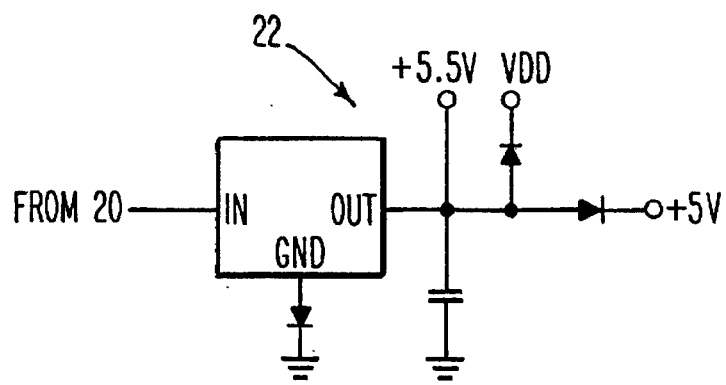
FIG. 7 is a schematic diagram of the 5 volt linear power supply shown in FIG. 1.

In order to appreciate how the reference voltage is generated consider FIG. 7. There is shown in greater detail the components included in linear power supply 22. The 5 V output of supply 22 is provided at 96 in FIG. 6. Resistor 98 and diode 100 combine to generate a precision 2.5 V reference voltage. It is noted at this point that Va, Vb, Vc, Ia, Ib and Ic are each provided to processor 14 in reference to VREF.

Figure 2:
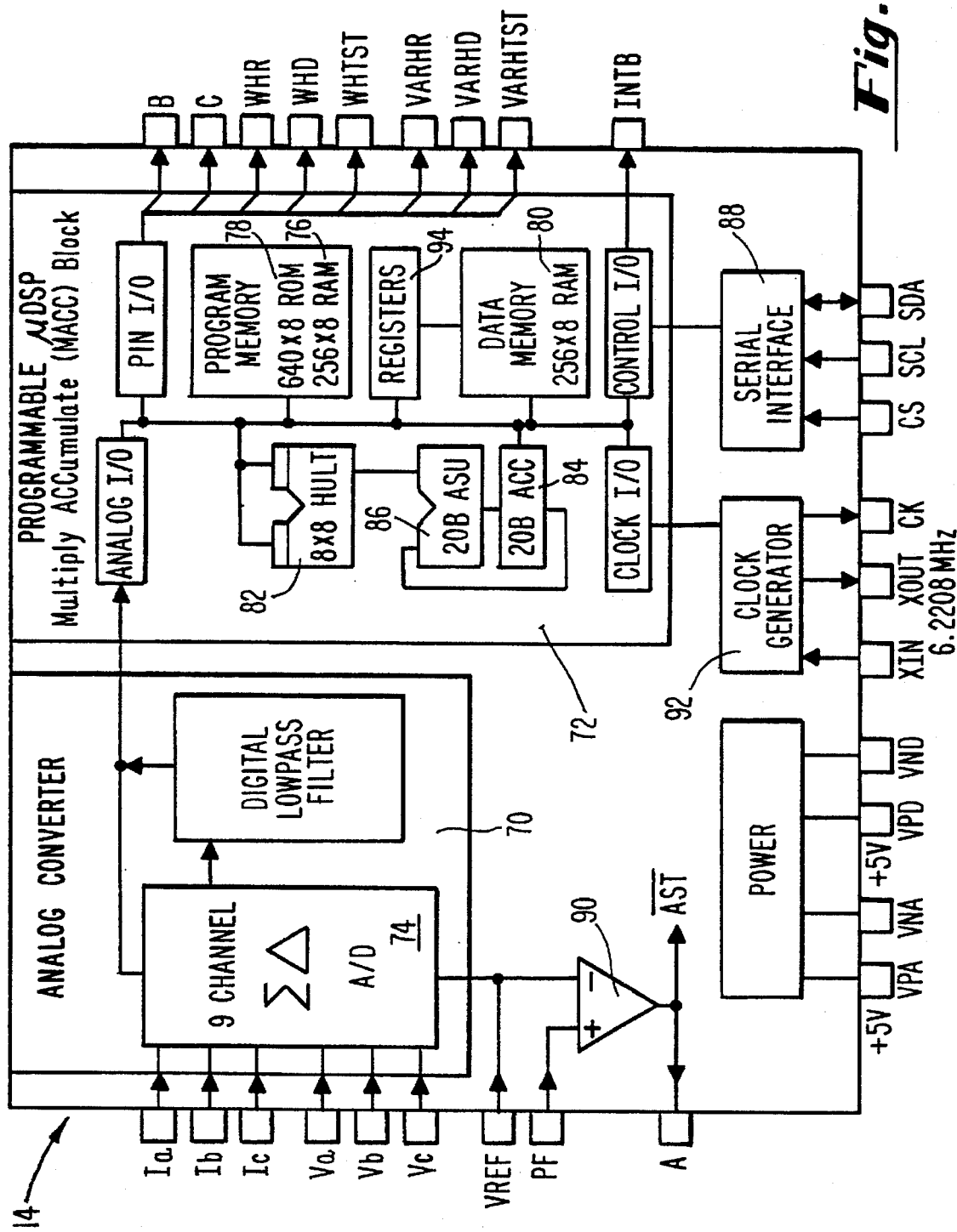
FIG. 2 is a block diagram of the A/D&DSP processor shown in FIG. 1.
Figure 3A:
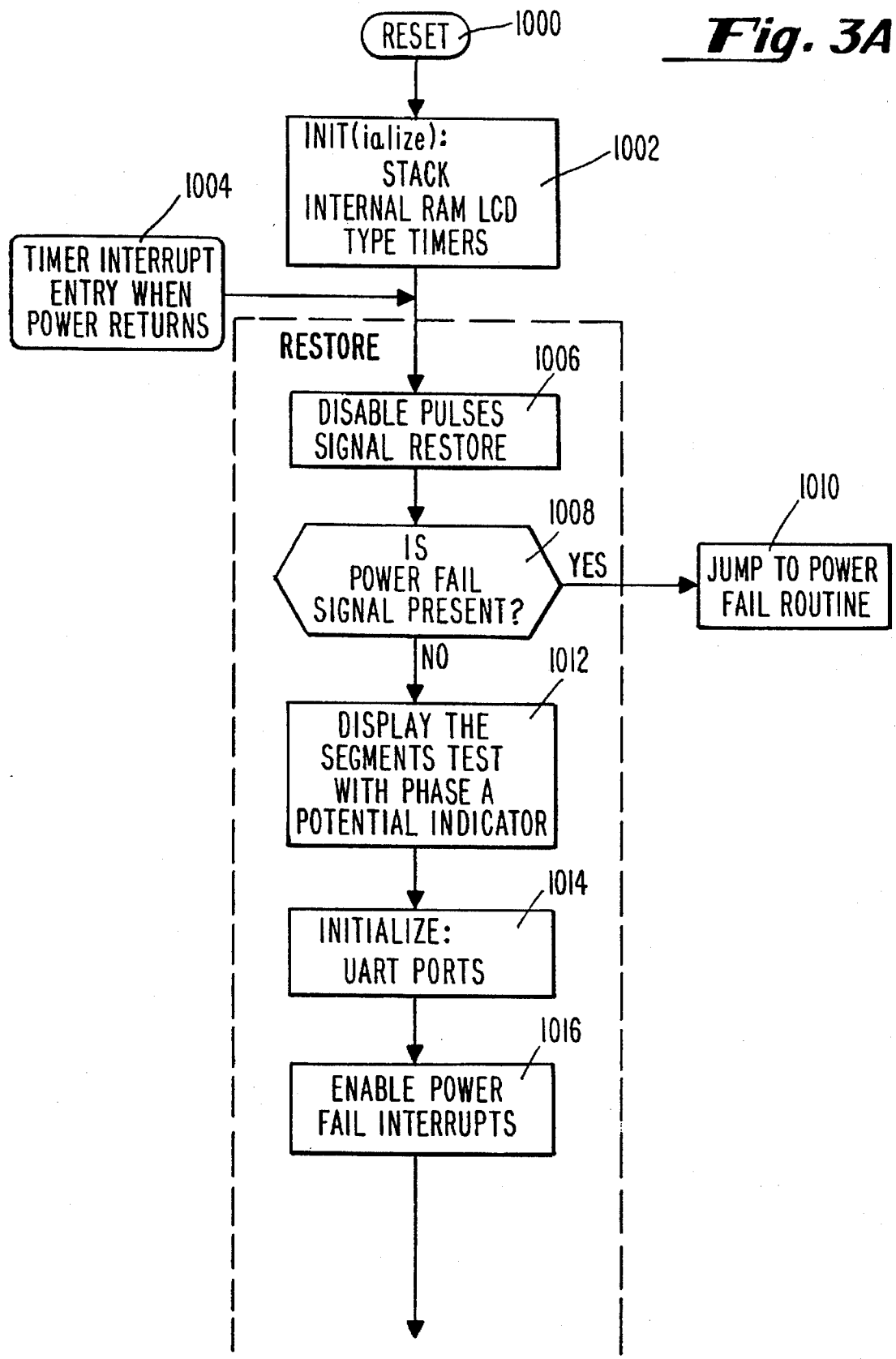
FIGS. 3A–3E combine to provide a flow chart of the primary program utilized by the microcontroller disclosed in FIG. 1.
Figure 3B:
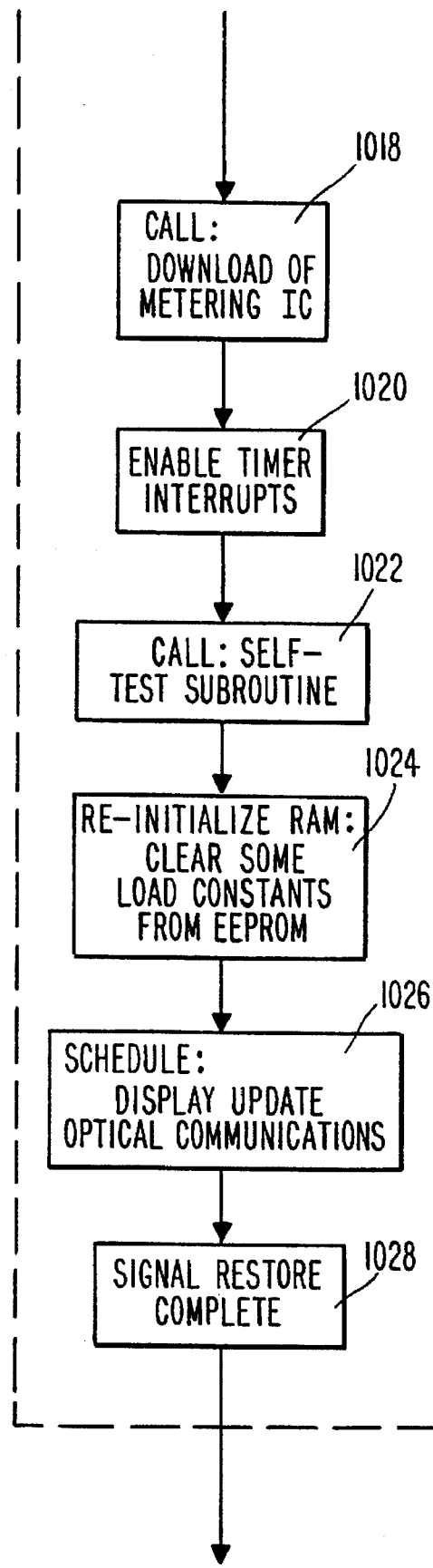
Figure 3C:
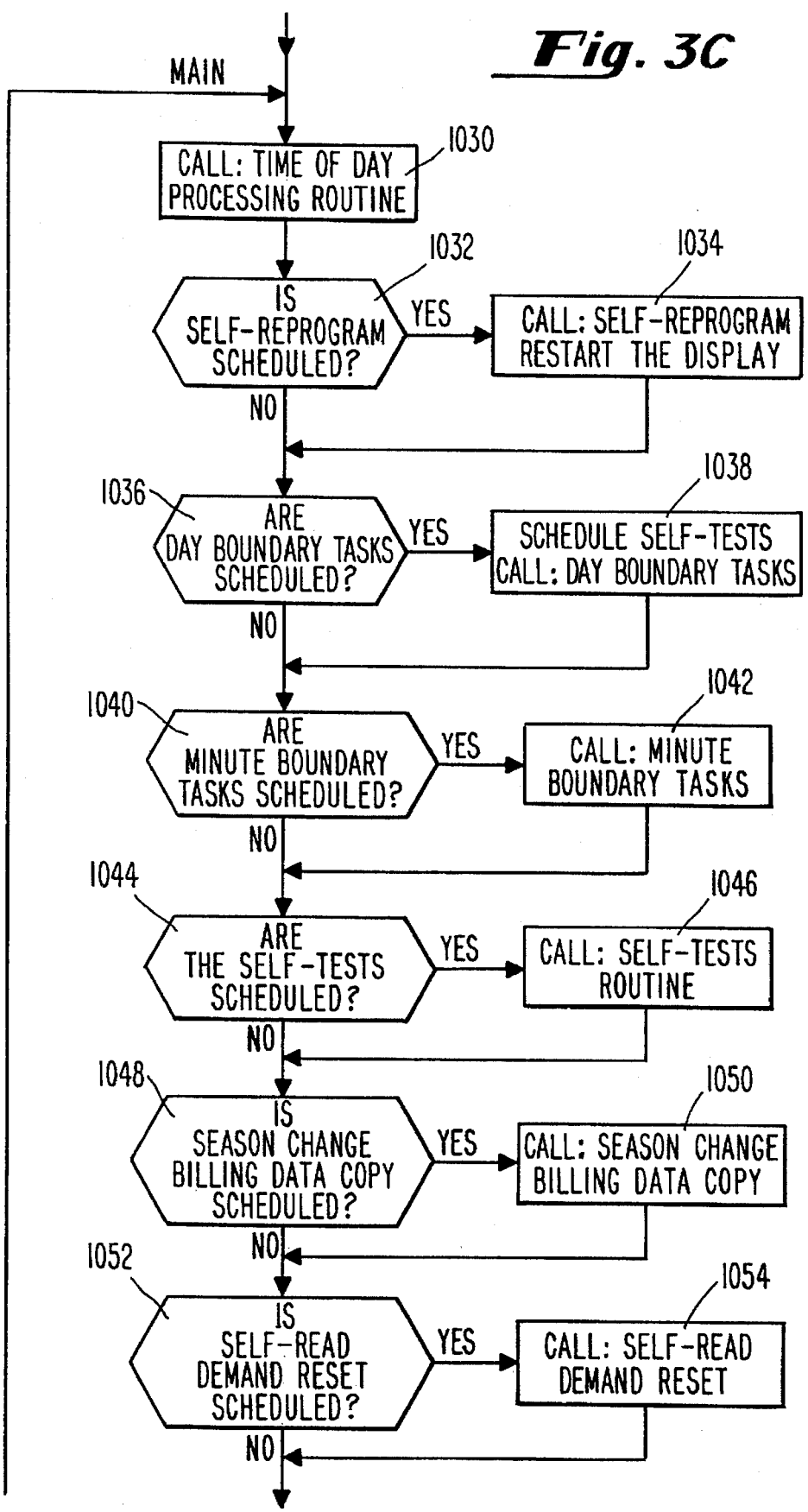
Figure 3D:
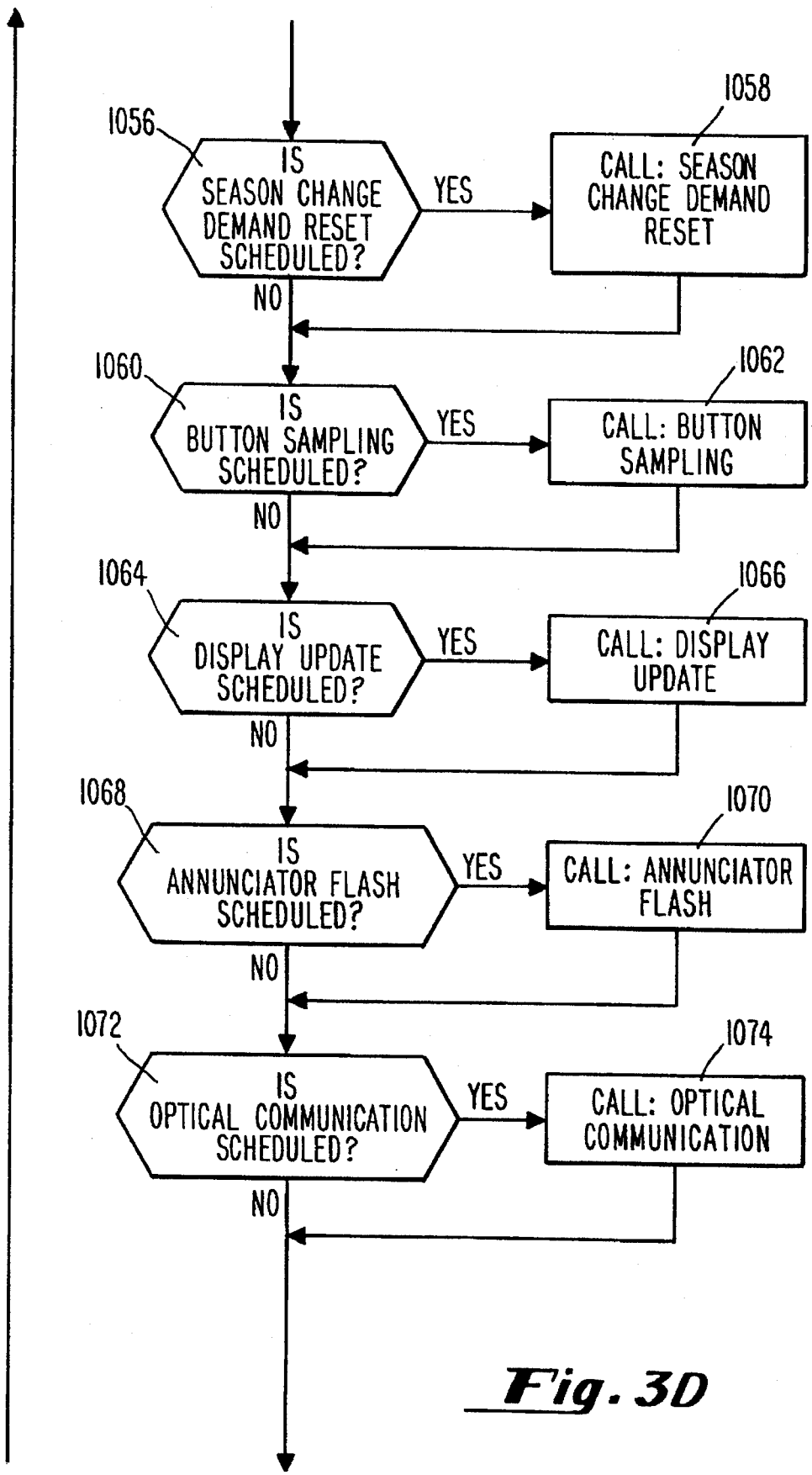
Figure 3E:
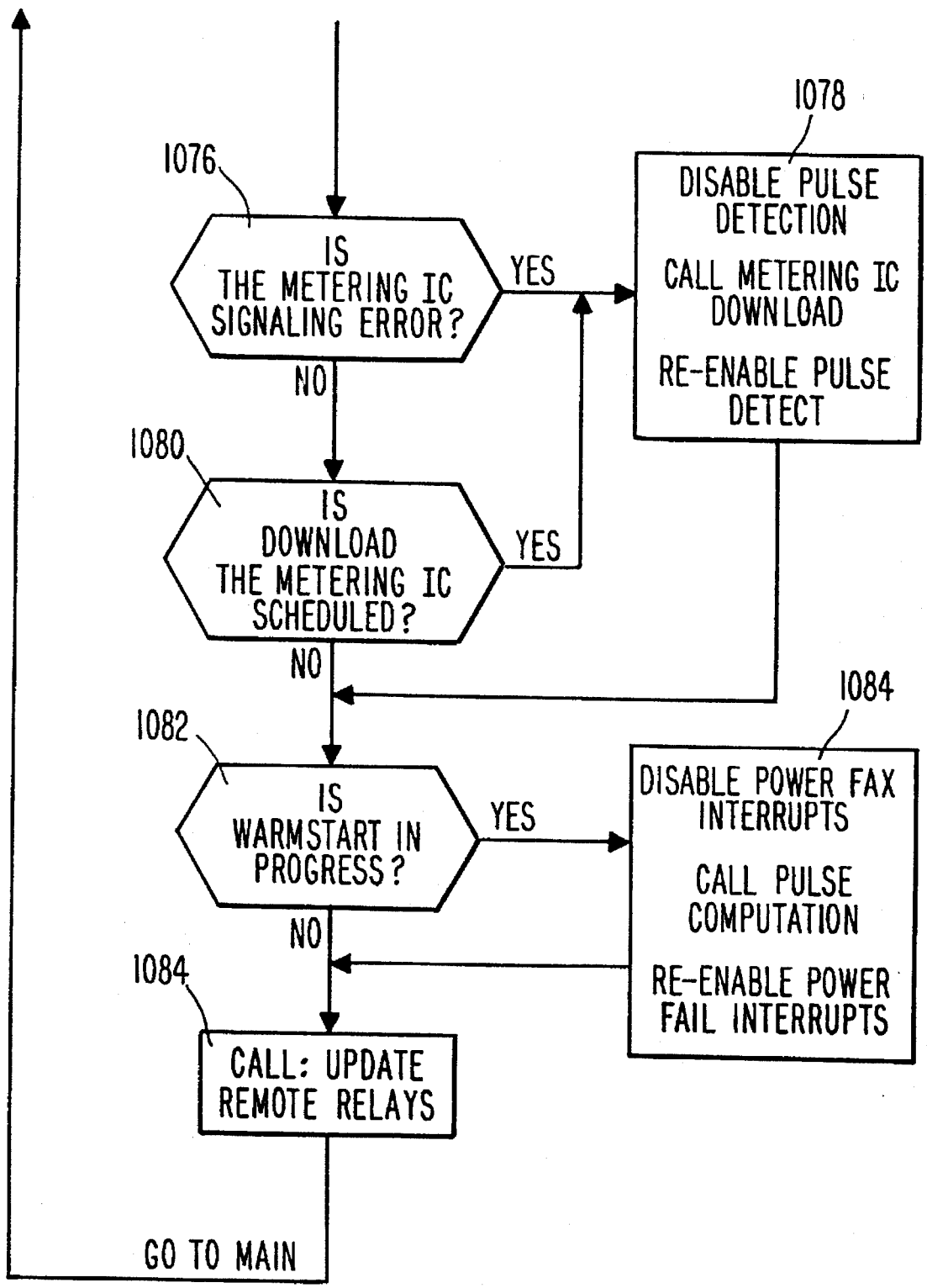

Consider again processor 14 as shown in FIG. 2. The phase B and C potential indicators outputs are under control of DSP 72. The B output is normally a logic level output. The C output also provides the power line time base function (note that phase C is present in all applications). To minimize noise at the power line fundamental, this time base is at two times the power line fundamental.

The M37428 microcontroller 16 is a 6502 (a traditional 8 bit microprocessor) derivative with an expanded instruction set for bit test and manipulation. This microcontroller includes substantial functionality including internal LCD drivers (128 quadraplexed segments), 8 kbytes of ROM, 384 bytes of RAM, a full duplex hardware UART, 5 timers, dual clock inputs (32.768 kHz and up to 8 MHz), and a low power operating mode.

During normal operation, processor 16 receives the 4.1472 MHz clock from processor 14 as described above. Such a clock signal translates to a 1.0368 MHz cycle time. Upon power fail, processor 16 shifts to the 32.768 kHz crystal oscillator 32. This allows low power operation with a cycle time of 16.384 kHz. During a power failure, processor 16 keeps track of time by counting seconds and rippling the time forward. Once processor 16 has rippled the time forward, a WIT instruction is executed which places the unit in a mode where only the 32,768 kHz oscillator and the timers are operational. While in this mode a timer is setup to "wake up" processor 16 every 32,768 cycles to count a second.

Consider now the main operation of processor 16 in relation to FIGS. 3A–3E and FIG. 4. At step 1000 a reset signal is provided to microcontroller 16. As will be appreciated in relation to the discussion of FIG. 5, a reset cycle occurs whenever the voltage level $V_{dd}$ rises through approximately 2.8 volts. Such a condition occurs when the meter is first powered up.

At step 1002, microcontroller 16 performs an initialize operation, wherein the stack pointer is initialized, the internal ram is initialized, the type of liquid crystal display is entered into the display driver portion of microcontroller 16 and timers which require initialization at power up are initialized. It will be noted that the operation of step 1002 does not need to be performed for each power failure occurrence. Following a power failure, microcontroller 16 at step 1004 returns to the main program at the point indicated when the power returns.

Upon initial power up or the return of power after a power failure, microcontroller 16 performs a restore function. At step 1006, microcontroller 16 disables pulses transmitted by processor 14. These pulses are disabled by providing the appropriate signal restore bit. The presence of this bit indicates that a restore operation is occurring and that pulses generated during that time should be ignored. Having set the signal restore bit, microcontroller 16 determines at step 1008 whether the power fail signal is present. If the power fail signal is present, microcontroller 16 jumps to the power fail routine at 1010. In the power fail routine, the output ports of microcontroller 16 are written low unless the restore bit has not been set. If the restore bit has not been set, data in the microcontroller 16 is written to memory.

If the power fail signal is not present, microcontroller 16 displays segments at step 1012. At this time, the segments of the display are illuminated using the phase A potential. It will be recalled that phase A potential is provided to microcontroller 16 from processor 14. At 1014, the UART port and other ports are initialized at 1016, the power fail interrupts are enabled such that if a falling edge is sensed from output A of processor 14, an interrupt will occur indicating power failure. It will be recalled that processor 14 compares the reference voltage VREF to a divided voltage generated by the power supply 20. Whenever the power supply voltage falls below the reference voltage a power fail condition is occurring.

At step 1018, the downloading of the metering integrated circuit is performed. Such downloading operation is described in greater detail in relation to FIG. 4. At step 1020, the timer interrupts are enabled. It will be appreciated that certain tasks performed by microcontroller 16 are time dependent. Such tasks will require a timer interrupt when the time for performing such tasks has arrived.

At 1022, the self-test subroutines are performed. Although no particular self-tests subroutine is necessary in order to practice the present invention, such subroutines can include a check to determine if proper display data is present. It is noted that data is stored in relation to class designation and that a value is assigned to each class such that the sum of the class values equals a specified number. If any display data is missing, the condition of the class values for data which is present will not equal the specified sum and an error message will be displayed. Similarly, microcontroller 16 compares the clock signal generated by processor 14 with the clock signal generated by watch crystal 32 in order to determine whether the appropriate relationship exists.

Having completed the self-test subroutines, the ram is re-initialized at 1024. In this re-initialization, certain load constants are cleared from memory. At 1026, various items are scheduled. For example, the display update is scheduled so that as soon as the restore routine is completed, data is retrieved and the display is updated. Similarly, optical communications are scheduled wherein microcontroller 16 determines whether any device is present at optical port 40, which device desires to communicate. Finally, at 1028 a signal is given indicating that the restore routine has been completed. Such a signal can include disabling the signal restore bit. Upon such an occurrence, pulses previously disabled will now be considered valid. Microcontroller 16 now moves into the main routine.

At 1030, microcontroller 16 calls the time of day processing routine. In this routine, microcontroller 16 looks at the one second bit of its internal and determines whether the clock needs to be changed. For example, at the beginning and end of Daylight Savings Time, the clock is moved forward and back one hour, respectively. In addition, the time of day processing routine sets the minute change flags and date change flags. As will be appreciated hereinafter, such flags are periodically checked and processes occur if such flags are present.

It will be noted that there are two real time interrupts scheduled in microcontroller 16 which are not shown in FIG. 3, namely the roll minute interrupt and the day interrupt. At the beginning of every minute, certain minute tasks occur. Similarly, at the beginning of every day, certain day tasks occur. Since such tasks are not necessary to the practice of the presently claimed invention, no further details need be provided.

At 1032, microcontroller 16 determines whether a self-reprogram routine is scheduled. If the self-reprogram routine is scheduled, such routine is called at 1034. The self-reprogram typically programs in new utility rates which are stored in advance. Since new rates have been incorporated, it will be necessary to also restart the display. After operation of the self-reprogram routine, microcontroller 16 returns to the main program. If it is determined at 1032 that the self-reprogram routine is not scheduled, microcontroller 16 determines at 1036 whether any day boundary tasks are scheduled. Such a determination is made by determining the time and day and searching to see whether any day tasks are scheduled for that day. If day tasks are scheduled, such tasks are called at 1038. If no day tasks are scheduled, microcontroller 16 next determines at 1040 whether any minute boundary tasks have been scheduled. It will be understood that since time of use switch points occur at minute boundaries, for example, switching from one use period to another, it will be necessary to change the data storage locations at such a point. If minute tasks are scheduled, such tasks are called at 1042. If minute boundary tasks have not been scheduled, microcontroller 16 determines at 1044 whether any self-test have been scheduled. The self-tests are typically scheduled to occur on the day boundary. As indicated previously, such self-tests can include checking the accumulative display data class value to determine whether the sum is equal to a prescribed value. If self-tests are scheduled, such tests are called at 1046. If no self-tests are scheduled, microcontroller 16 determines at 1048 whether any season change billing data copy is scheduled. It will be appreciated that as season changes billing data changes. Consequently, it will be necessary for microcontroller 16 to store energy metered for one season and begin accumulating energy metered for the following season. If season change billing data copy is scheduled, such routine is called at 1050. If no season change routine is scheduled, microcontroller 16 determines at 1052 whether the self-redemand reset has been scheduled. If the self-redemand reset is scheduled, such routine is called at 1054. This routine requires microcontroller 16 to in effect read itself and store the read value in memory. The demand reset is then reset. If the self-demand reset has not been scheduled, microcontroller 16 determines at 1056 whether a season change demand reset has been scheduled. If a season change demand reset is scheduled, such a routine is called at 1058. In such a routine, microcontroller 16 reads itself and resets the demand.

Figure 8:
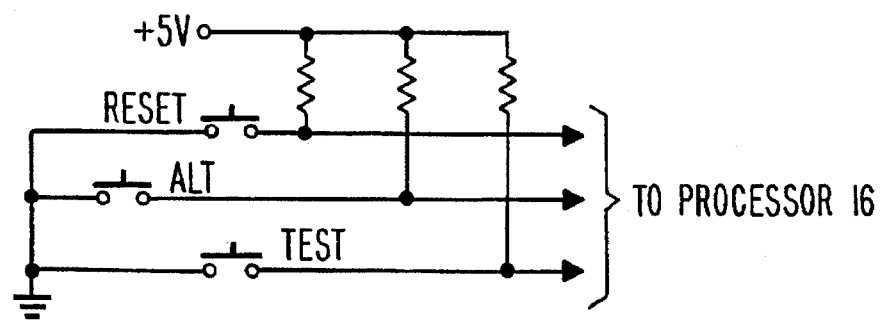
FIG. 8 is a schematic diagram of various electronic button switches utilized by the microcontroller shown in FIG. 1.

At 1060, microcontroller 16 determines whether button sampling has been scheduled. Reference is made to FIG. 8 for a more detailed description of an arrangement of buttons to be positioned on the face of meter 10. Button sampling will occur every eight milliseconds. Consequently, if an eight millisecond period has passed, microcontroller 16 will determine that button sampling is scheduled and the button sampling routine will be called at 1062.

If button sampling is not scheduled, microcontroller 16 determines at 1064 whether a display update has been scheduled. This routine causes a new quantity to be displayed on LCD 30. As determined by the soft switch settings mentioned above, display updates are scheduled generally for every three-six seconds If the display is updated more frequently, it may not be possible to read the display accurately. If the display update has been scheduled, the display update routine is called at 1066.

If a display update has not been scheduled, microcontroller 16 determines at 1068 whether an annunciator flash is scheduled. It will be recalled that certain annunciators on the display are made to flash. Such flashing typically occurs every half second. If an annunciator flash is scheduled, such a routine is called at 1070. If no annunciator flash is scheduled, microcontroller 16 determines at 1072 whether optical communication has been scheduled. It will be recalled that every half second microcontroller 16 determines whether any signal has been generated at optical port. If a signal has been generated indicating that optical communications is desired, the optical communication routine will be scheduled. If the optical communication routine is scheduled, such routine is called at 1074. This routine causes microcontroller 16 to sample optical port 40 for communication activity.

If no optical routine is scheduled, microcontroller 16 determines at 1076 whether processor 14 is signaling an error. If processor 14 is signaling an error, microcontroller 16 at 1078 disables the pulse detection, calls the download routine and after performance of that routine, re-enables the pulse detection. If processor 14 is not signaling any error, microcontroller 16 determines at 1080 whether the download program is scheduled. If the download program is scheduled, the main routine returns to 1078 and thereafter back to the main program.

If the download program has not been scheduled or after the pulse detect has been re-enabled, microcontroller 16 determines at 1082 whether a warmstart is in progress. If a warmstart is in progress, the power fail interrupts are disabled at 1084. The pulse computation routine is called after which the power fail interrupts are re-enabled. It will be noted that in the warmstart data is zeroed out in order to provide a fresh start for the meter. Consequently, the pulse computation routine performs the necessary calculations for energy previously metered and places that computation in the appropriate point in memory. If a warmstart is not in progress, microcontroller 16 at 1084 updates the remote relays. Typically, the remote relays are contained on a board other than the electronics assembly board.

Figure 4:
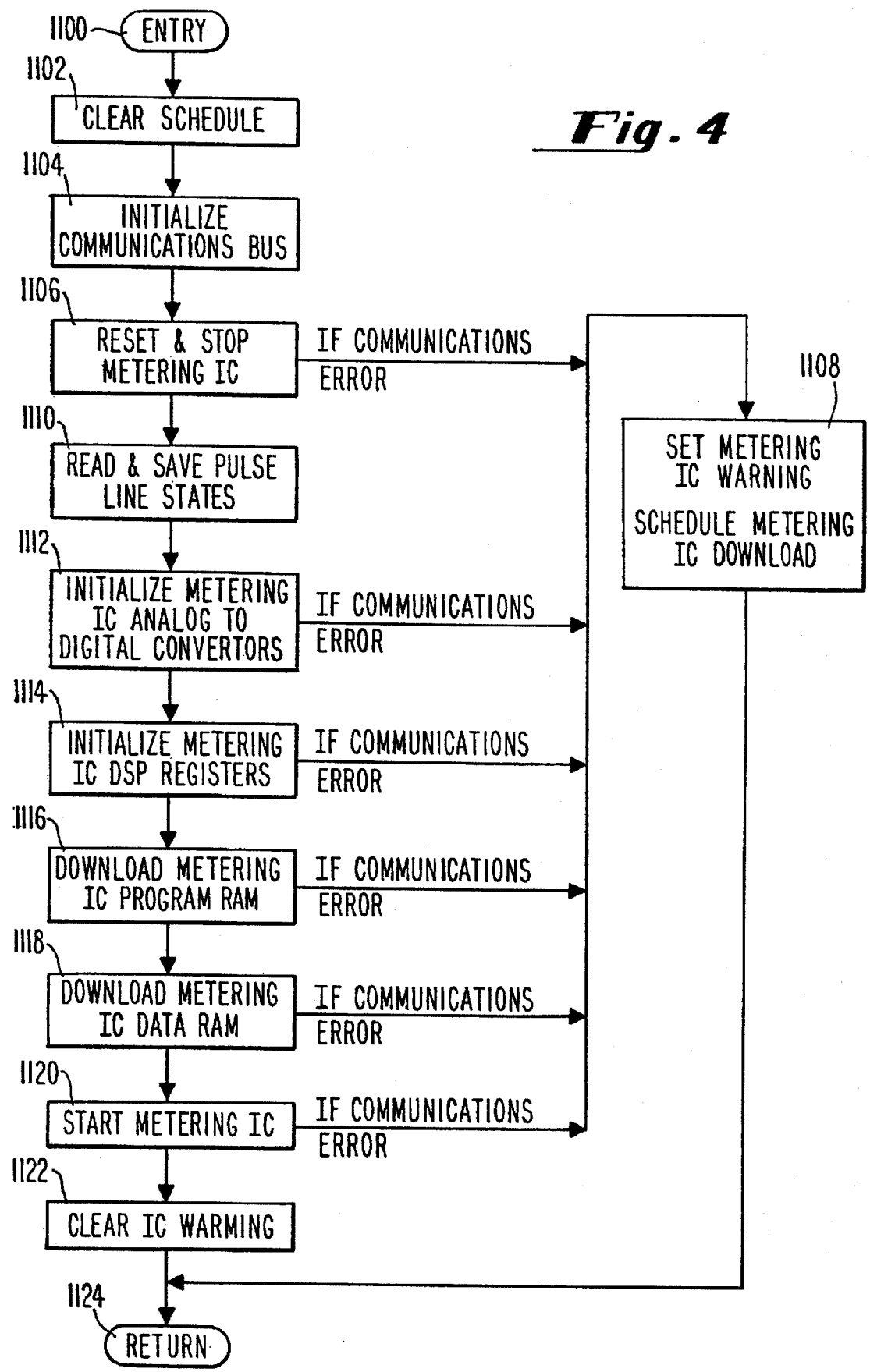
FIG. 4 is a flew chart of the download program utilized by the microcontroller shown in FIG. 1.

Referring now to FIG. 4, the program for downloading processor 14 will be described. At 1100, microcontroller 16 enters the program. At 1102, the schedule indicating that a metering download should take place is cleared. At 1104, Microcontroller 16 initializes the communication bus, which in the preferred embodiment is INTB. At 1106, microcontroller 16 resets and stops processor by way of an interrupt on processor 14. However, if there is a communications error between microcontroller 16 and processor 14, microcontroller 16 at 1108 sets a warning and schedules a download of processor 14. After 1108 the downloading program is terminated, microcontroller 16 returns to the main routine.

At 1110, microcontroller reads and saves the pulse line states. It will be recalled that as processor 14 makes energy determinations, each unit of energy is represented by a logic transition on outputs 42–48 (FIG. 1). At 1110 the state of each output 42–48 is saved. At 1112, microcontroller initializes A/D converters 74, if a communication error occurs, microcontroller proceeds to 1108. At 1114 the digital signal processing registers 94 are initialized. At 1116 program memory 78 is downloaded to memory. At 1118, the data memory 80 is downloaded to memory. At 1120, processor 14 is started. If a communication error occurs at any of steps 1114–1120, microcontroller 16 again returns to 1108. At 1122, any warning messages previously set at 1108 are cleared. At 1124, microcontroller 16 returns to its main program.

All data that is considered non-volatile for meter 10, is stored in a 2 kbyte EEPROM 35. This includes configuration data (including the data for memory 76 and memory 80), total kWh, maximum and cumulative demands (Rate A demands in TOU), historic TOU data, cumulative number of demand resets, cumulative number of power outages and the cumulative number of data altering communications. The present billing period TOU data is stored in the Ram contained within processor 16. As long as the microcontroller 16 has adequate power, the Ram contents and real time are maintained and the microcontroller 16 will not be reset (even in a demand register).

As indicated previously, operational constants are stored in EEPROM data. Microcontroller 16 performs checks of these memory areas by adding the class designations for various data and comparing the sum to a reference number. For example, the data class is used to define the 256 byte block of program memory. Appended to the 256 bytes of program in this data class is the DSP code identification, revision number, and the checksum assigned to this data class. The operational constants consist of the calibration constants and data RAM initial values, the meter's secondary Ke and Kh, and information that the microcontroller must use to process the meter's data.

LCD 30 allows viewing of the billing and other metering data and statuses. Temperature compensation for LCD 30 is provided in the electronics. Even with this compensation, the meter's operating temperature range and the LCD's 5 volt fluid limits LCD 30 to being triplexed. Hence, the maximum number of segments supported in this design is 96. The display response time will also slow noticeably at temperatures below–30 degrees celsius. For a more complete description of display 30, reference is made to co-pending application having Attorneys Docket No. B900260/ABME-0009, filed concurrently herewith and incorporated herein by reference.

Figure 5:
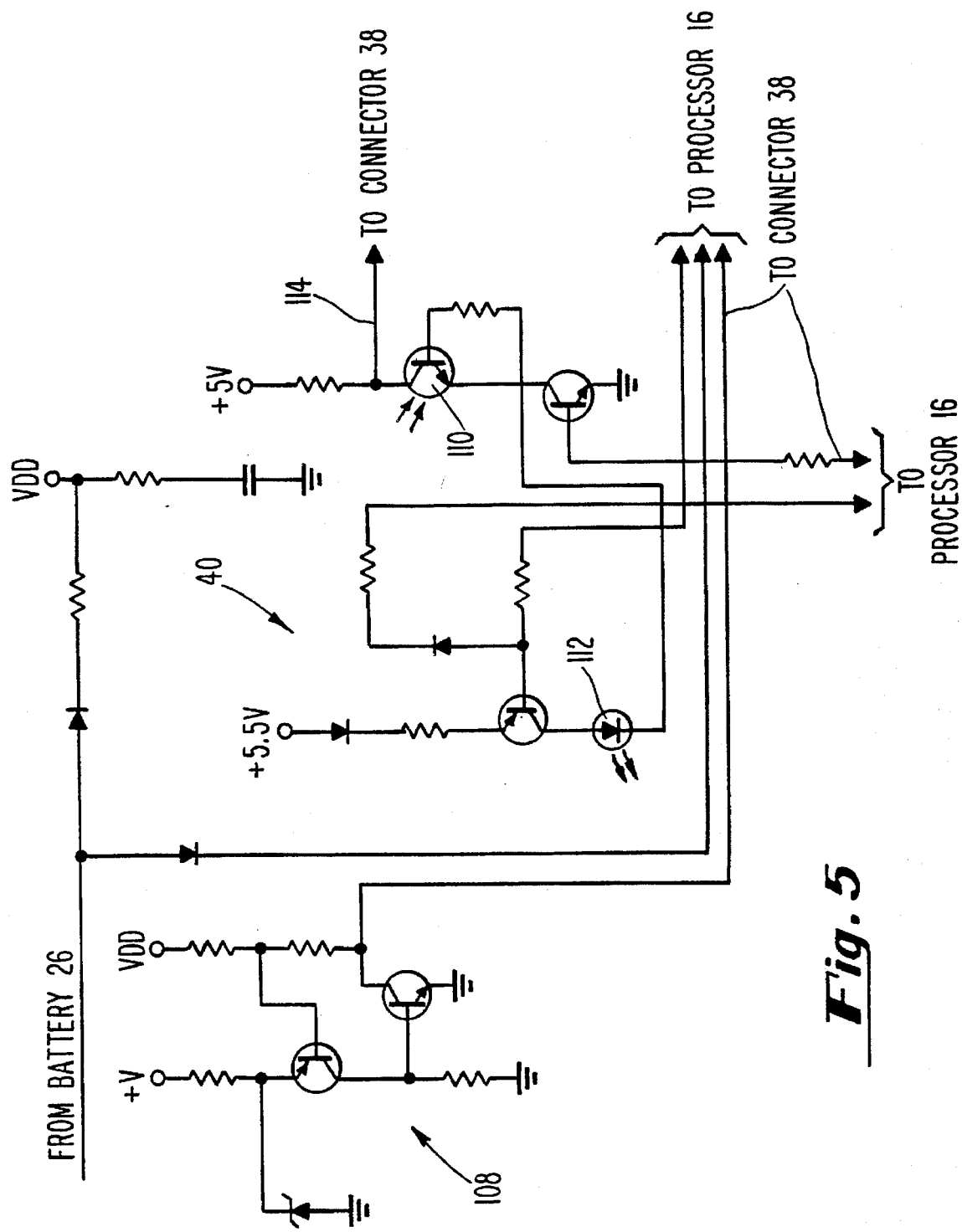
FIG. 5 is a schematic diagram of the optical port disclosed in FIG. 1.

Referring now to FIG. 5, optical port 40 and reset circuitry 108 are shown in greater detail. On power up, reset 108 provides an automatic reset pulse to processor 16. In operation, circuit 108 acts as a comparator, comparing a portion of the voltage generated by power supply 22 to the voltage provided by non-volatile supply 24. Whenever the voltage generated by power supply 22 either falls below or rises above that of the non-volatile supply, such a condition is an indication that the meter has either lost power or power has been restored and a reset signal is provided to processor 16.

Optical port 40 provides electronic access to metering information. The transmitter and receiver (transistors 110 and 112) are 850 nanometer infrared components and are contained in the electronics assembly (as opposed to being mounted in the cover). Transistor 110 and LED 112 are tied to microcontroller 16's UART and the communications rate (9600 baud) is limited by the response time of the optical components. The optical port can also be disabled from the UART (as described below), allowing the UART to be used for other future communications without concern about ambient light. During test mode, the optical port will echo the watthour pulses received by the microcontroller over the transmitting LED 112. While in test mode microcontroller 16 will monitor the receive line 114 for communications commands.

One feature which results from the distributed processing scheme described above is the adaptability or expandability of the invention in future applications. To this end, option connector 38 will play a key role. As shown in FIG. 1, option connector provides a connection from processor 16 to the outside world. Through connector 38 data output from processor 14 to EEPROM 35 or data output to processor 16 can be monitored. As will be described below, communication with processor 16 can occur since connector 38 is directly connected to several ports on processor 16. Thus through option connector 38, communication with processor 16 is possible and the operation of processor 16 may be modified. For example, connector 38 may be used in order to convert meter 10 effectively into a peripheral device for another microcontroller (not shown). Option connector 38 might be used in relation to a modem in order to access pieces of data or to operate optical port 40 in some desired fashion. Connector 38 may also be used in relation to so called 3rd party services. In such situations, third parties may be contracted to service the meter using their own equipment. Through connector 38 it may be possible to more readily adapt such equipment to be capable of servicing meter 10. Connector 38 may also be utilized for the connection of a device for the storage of an energy use profile. Such devices require nonvolatile supply voltages. The features made available on connector 38 makes it possible to "piggy-back" such a device on meter 10.

As indicated above, it is desirable for meter 10 to economically perform existing polyphase demand and time-of-use (TOU) metering as well as be the platform for future metering products. Unfortunately, little is known about the future. The problem therefore is how one allows for the changes the future might bring. The approach taken by the invention, allows the electronics in meter 10 to act as a peripheral device to an option board (not shown) connected to option connector 38, while supplying nominal power requirements for the option board. All power, signals, and communications to the option board are provided over a 20 pin connection. Meter 10 provides the following power signals:

V+ A semi-regulated 12 VDC to 15 VDc supply (the output of supply 20);

5 V A regulated 5 V volatile supply (the output of supply 22);

VDD A regulated 5 V non-volatile supply (the output of supply 24); and

Gnd The negative reference.

In the preferred embodiment, the option board is allowed a combined current draw of 50 mA on these three supply signals. The option board can be allowed to draw up to 100 μA from a supercapacitor contained in the output portion of supply 20 and battery 26 via supply 24 during a power outage, however, such an arrangement will reduce battery life. Referring to FIG. 1, meter 10 also provides the following operational signals to option connector 38:

PFail Preferably logic level low (0) indicates the absence of AC power;

MR Master Reset—A logic level low (0) generated by circuit 108 (FIG. 5), used to reset the microcontroller upon loss of VDD (preferably defined as VDD falling below 2.8 to 2.2 volts);

Alt An echo or duplication of the alternate display button position (determined by processor 16 at 1060);

Reset An echo or duplication of the demand reset button position (determined by processor 16 at 1060);

EOI End of demand interval indication, generated by processor 16 in relation to the main program at 1052, preferably high for one second at the end of the demand interval;

KYZ1 A KYZ output signal of watthour pulses subject to a pulse frequency divider and a watthour accumulation definition, wherein the accumulation definition allows the KYZ signal to repeat the watthours delivered pulses or a combination of watthours delivered and watthours received pulses;

KYZ2 A KYZ output signal of the VARhour or VAhour pulses also subject to the KYZ divider and accumulation definition;

WHR The watthour received pulse train from processor 14; and

VARHR The VARhours received pulse train from processor 14.

By providing the PFail signal to option connector 38, determinations can be made of when AC power is no longer present. In the preferred embodiment, meter 10 guarantees that 100 ms of power supply remains when the PFail signal is generated. The Master Reset signal can be used to reset any microprocessor that may be connected to option connector 38, if it is powered from the $V_{dd}$ supply. Otherwise, an option board microcomputer can be reset from a time delay on the PFail line. The KYZ1, KYZ2, WHR, and VARHR signals can be used to monitor the various power flow measurements. The EOI signal can be used to synchronize demand intervals between processor 16 and a microcomputer connected to option connector 38.

Meter 10 further provides the following communications connections:

SC1 Serial Clock—connection to serial communications line 36, particularly the serial clock connection with serial interface 88 (FIG. 2), wherein a serial clock is transmitted conforming to the I²C serial protocol;

SDA Serial Data—connection to serial communications line 36, particularly the serial data connection with serial interface 88 (FIG. 2), wherein serial bi-directional serial data is transmitted conforming to the I²C serial protocol;

RX A connection to the serial receive communications line connecting processor 16 and optical port 40;

TX A connection to the serial transmit communications line connecting processor 16 and optical port 40;

OPE Optical Port Enable—a connection to processor 16 and optical port 40 wherein a logic level high (1) allows access to optical port 40 by the RX and TX signals provided to option connector 38 by an option board;

OPS Optical Port Select—a connection to processor 16, wherein a logic level high (1) results in processor 16 controlling the drive to optical port 40 and logic level low (0) allows a microprocessor connected to option connector 38 to drive optical port 40; and DS Display Select—a connection to processor 16 wherein a logic level high (1) results in processor 16 controlling the drive to liquid crystal display 30 and logic level low (0) allows a microprocessor connected to option connector 38 to drive display 30.

The SC1 and SDA connections could be used to drive an I²C I/O expander which in turn would provide signals from meter 10 to multiple output relays. The RX, TX, and OPE connections would normally be used to drive optical port 40. If the OPS line is pulled low, processor 16 would no longer attempt to drive optical port 40, but instead would listen at 9600 baud for an option board microcomputer to "talk" to processor 16. When the OPE line is high, processor 16 is commanded to assume that the option board is communicating out optical port 40 and thus to ignore the communication. This allows meter 10 through processor 16 to become a communications and data processing peripheral to option connector 38. EEPROM 35, in the preferred embodiment has 256 bytes of extra memory space that can be accessed by through option connector 38 via the normal communications protocol. In such a situation, meter 10 can be either a data storage or configuration storage peripheral.

When the signal on the DS connection is high, processor 16 controls display 30 per information processor 16 stores in EEPROM 35. It will be noted that, in the preferred embodiment, the liquid crystal display is controlled in relation to information contained in a display table (not shown) which table contains identifier and data fields (numeric fields and identification annunciators) and which table is stored in memory 35. In the preferred embodiment, the display table is a display segment memory map stored in memory 35 to produce the desired display image on display 30. When processor 16 controls display 30, the display table is periodically updated with information generated by processor 16. If the DS line is pulled low through option connector 38, processor 16 no longer updates the display table. In such a situation, a special communications command is provided in processor 16 to allow the display identifiers and data to be written through option connector 38, preferably by a microcomputer connected to connector 38. Thus meter 10 has the flexibility to become a display peripheral to an option board.

In an especially preferred embodiment, pulse indicators, potential indicators, the "EOI" indicator, and the "Test" indicator located in display 30 are controlled by fields in the display table, which fields can only be modified by information generated by processor 16. In such an embodiment, even if DS is low, processor 16 will still generate this certain field information. Information provided meter 10 through option connector 38 will be exclusive ORed with information generated by processor 16 to update the display table.

It will be appreciated from the above that an option board can be easily added to meter 10. As discussed above, the option board can then take control of most functions of meter 10, including modifying the basic metering function and reading processor 14 directly via processor 16. This aspect to the design allows a great deal of flexibility for future, yet undefined, functions.

In addition to the option board connector, space is preferably provided in chassis (not shown) of meter 10 for additional large components, such as carrier coupling components or a larger power supply transformer. The voltage connections in the meter base provide additional tabs for picking off the line voltage for parts of this nature.

Meter 10 also provides the ability to be placed in the test mode and exit from the test mode via a new optical port function. When in an optically initiated test mode, the meter will echo metering pulses as defined by the command on the optical port transmitter. The meter will listen for further communications commands. Additional commands can change the rate or measured quantity of the test output over the optical port. The meter will "ACK" any command sent while it is in the test mode and it will "ACK" the exit test mode command. While in an optically initiated test mode, commands other than those mentioned above are processed normally. Because there is the possibility of an echoed pulse confusing the programmer/readers receiver, a command to stop the pulse echo may be desired so communications can proceed uninterrupted. If left in test mode; the usual test mode time out of three demand intervals applies. For a more complete description of the test mode, reference is made to co-pending application ABB-0009.

TABLE 1

Meter Formulae

Watt formulae $$-3\text{:Watts} = K_G(K_A V_{A_0} I_{A_0} + K_B V_{B_1} I_{B_1} + K_C V_{C_2} I_{C_2})$$
$$-2\text{:Watts} = K_G((K_A V_{A_0} - K_B V_{B_0}) I_{A_0} + (K_C V_{C_2} - K_D V_{B_2}) I_{C_2})$$
$$-8\text{:Watts} = K_G(K_A V_{A_0} I_{A_0} - (K_B V_{A_0} I_{B_0} + K_D V_{C_2} I_{B_2}) + K_C V_{C_2} I_{C_2})$$
$$-7\text{:Watts} = K_G(K_A V_{A_0} I_{A_0} - K_B V_{A_0} I_{B_0} + K_C V_{C_2} I_{C_2})$$

NOTE: Subscripts refer to the phase of the inputs. Sub-subscripts refer to the A/D cycle in which the sample is taken. Va for $-7$ applications is actually line to neutral.

VA Formulae $$-3\text{:}VA = K_G(K_A V_{A_0 rms} I_{A_0 rms} + K_B V_{B_1 rms} I_{B_1 rms} + K_C V_{C_1 rms} I_{C_2 rms})$$

$$-2\text{:}VA = K_G((K_A V_{A_0} - K_B V_{B_0})_{rms} I_{A_0 rms} + (K_C V_{C_2} - K_D V_{B_2})_{rms} I_{C_2 rms})$$

$$-8\text{:}VA = K_G\left(K_A V_{A_0 rms} I_{A_0 rms} + \frac{(K_B V_{A_0 rms} + K_d V_{C_2 rms})}{2} I_{B_0 rms} + K_C V_{C_2 rms} I_{C_2 rms}\right)$$

$$-7\text{:}VA = K_G(K_A V_{A_0 rms} I_{A_0 rms} + K_B V_{A_0 rms} I_{B_0 rms} + K_C V_{C_2 rms} I_{C_2 rms})$$

RMS measurements are made over one line cycle and preferably begin at the zero crossing of each voltage.

VAR Formula $$VAR = \sqrt{VA_A^2 - \text{Watt}_A^2} + \sqrt{VA_B^2 - \text{Watt}_B^2} + \sqrt{VA_C^2 - \text{Watt}_C^2}$$

where the subscripts are associated with the I terms of Watts and VAs and the calculation is performed every cycle as shown below:

$$-3\text{:}VAR = K_G\left(K_A \sqrt{(V_{A_0 rms} I_{A_0 rms})^2 - \left(\sum_{zero}^{cycle} V_{A_0} I_{A_0}\right)^2} + K_B \sqrt{(V_{B_1 rms} I_{B_1 rms})^2 - \left(\sum_{zero}^{cycle} V_{B_1} I_{B_1}\right)^2} + K_C \sqrt{(V_{C_2 rms} I_{C_2 rms})^2 - \left(\sum_{zero}^{cycle} V_{C_2} I_{C_2}\right)^2}\right)$$

$$-2\text{:}VAR = K_G\left(\sqrt{((K_A V_{A_0} - K_B V_{B_0})_{rms} I_{A_0 rms})^2 - \left(\sum_{zero}^{cycle} (K_A V_{A_0} - K_B V_{B_0}) I_{A_0}\right)^2} + \sqrt{((K_C V_{C_2} - K_D V_{B_1})_{rms} I_{C_2 rms})^2 - \left(\sum_{zero}^{cycle} (K_C V_{C_2} - K_D V_{B_2}) I_{C_2}\right)^2}\right)$$

-continued $$-8: VAR = K_G \left( K_A \sqrt{(V_{A_0 rms} I_{A_0 rms})^2 - \left( \sum_{zero}^{cycle} V_{A_0} I_{A_0} \right)^2 } + \right.$$

$$\sqrt{ \left( \frac{1}{2} (K_B V_{A_0 rms} + K_D V_{C_2 rms}) I_{B_0 rms} \right)^2 - \left( \sum_{zero}^{cycle} (K_B V_{A_0} I_{B_0} + K_D V_{C_2} I_{B_2}) \right)^2 } +$$

$$\left. K_C \sqrt{ (V_{C_2 rms} I_{C_2 rms})^2 - \left( \sum_{zero}^{cycle} V_{C_2} I_{C_2} \right)^2 } \right)$$

$$-7: VAR = K_G \left( K_A \sqrt{(V_{A_0 rms} I_{A_0 rms})^2 - \left( \sum_{zero}^{cycle} V_{A_0} I_{A_0} \right)^2 } + K_B \sqrt{(V_{A_0 rms} I_{B_0 rms})^2 - \left( \sum_{zero}^{cycle} V_{A_0} I_{B_0} \right)^2 } + \right.$$

$$\left. K_C \sqrt{ (V_{C_2 rms})^2 - \left( \sum_{zero}^{cycle} V_{C_2} I_{C_2} \right)^2 } \right)$$

For purposes of the above formulae, the following definitions apply:

−2 means a 2 element in 3 wire delta application;
−3 means a 3 element in 4 wire wye application;
−8 means a 2½ element in 4 wire wye application;
−5 means a 2 element in 3 wire delta application;
−7 is a 2½ element in 4 wire delta application.

While the invention has been described and illustrated with reference to specific embodiments, those skilled in the art will recognize that modification and variations may be made without departing from the principles of the invention as described herein above and set forth in the following claims.

What is claimed is:

1. Apparatus for electronically metering electrical energy, said electrical energy comprising voltage and current characteristics, wherein voltage and current signals representative of said voltage and current characteristics are provided, said apparatus comprising:

a first processor, connected to receive said voltage and current signals, for determining electrical energy from said voltage and current signals and for generating an energy signal representative of the electrical energy determination;

a second processor, connected to said first processor, for receiving said energy signal, for generating an indication signal representative of said energy signal; and an option connector, connected to said first processor and said second processor, whereby said energy signal is provided to said option connector and a communication connection is provided between said option connector and said second processor.

2. The apparatus of claim 1, wherein said first processor comprises an analog to digital converter for converting said voltage and current signals to voltage and current digital signals.

3. The apparatus of claim 1, further comprising a power supply, connected to receive said voltage signal, for generating a power signal, said power signal being provided to said option connector, whereby a power connection is provided.

4. The apparatus of claim 3, wherein said power supply comprises a semi-regulated power source, a regulated power source and a non-volatile power source and wherein an electrical ground is provided, said option connector further providing a semi-regulated power connection, a regulated power connection, a non-volatile power connection and an electrical ground connection.

5. The apparatus of claim 3, wherein a reference voltage is provided, wherein said power supply generates a precision reference voltage and wherein said first processor comprises a comparator, connected to receive said precision voltage and said reference voltage, for comparing said reference and precision voltages and for generating a comparator signal representative of such comparison.

6. The apparatus of claim 5, wherein said comparator signal is provided to said option connector.

7. The apparatus of claim 6, further comprising reset circuitry, connected to said regulated power source and said non-volatile source, for comparing said regulated power signal and said non-volatile power signal and for generating a reset signal representative of such comparison.

8. The apparatus of claim 7, wherein said reset signal is provided to said option connector.

9. The apparatus of claim 1, further comprising a display for displaying said indication signal and a state button located on said display, said state button being connected to said second processor, wherein said second processor generates and provides a status signal to said option connector representative of the condition of said state button.

10. The apparatus of claim 1, wherein said second processor generates an end of demand signal representative of the end of a demand interval for electrical energy and wherein said end of demand signal is provided to said option connector.

11. The apparatus of claim 1, wherein said second processor generates a KYZ signal in relation to said energy signal, said KYZ signal being representative of the flow of electrical energy and wherein said KYZ signal is provided to said option connector.

12. The apparatus of claim 1, wherein said second processor is capable of generating and receiving serial data signals, wherein said serial data signals are provided to said option connector.

13. The apparatus of claim 1, further comprising a display, connected to receive said indication signal, for displaying electrical energy information.

14. The apparatus of claim 1, further comprising a power supply for supplying power to said first and second processors.

15. The apparatus of claim 1, further comprising a programmable read only memory connected to said first and second processors, for storing data used by said first and second processors and for storing information generated by said first and second processors.

16. The apparatus of claim 15, wherein said programmable read only memory is electrically erasable.

17. The apparatus of claim 1, further comprising a light converter for converting light to an electrical signal, said light converter connected to said second processor.

18. The apparatus of claim 17, wherein said second processor is capable of generating and receiving communication signals through said light converter, wherein any generated or received communication signals through said light converter are provided to said option connector.

19. The apparatus of claim 17, further comprising an electrical connection between said light converter and said option connector, wherein the provision of said electrical signal to said second processor can be controlled through said electrical connection.

20. The apparatus of claim 17, wherein said first processor comprises a first program, wherein said first processor determines electrical energy and generates said energy signal in response to said first program, wherein said first program can be modified in response to a program signal transmitted by said second processor and wherein said program signal can be provided to said second processor through said light converter, whereby the determination of electrical energy and the generation of said energy signal can be modified in response to signals transmitted through said light converter.

* * * * *